United States Patent
Kokufu et al.

(10) Patent No.: US 6,713,688 B2
(45) Date of Patent: Mar. 30, 2004

(54) CIRCUIT BOARD AND ITS MANUFACTURE METHOD

(75) Inventors: Shinobu Kokufu, Osaka (JP); Takeshi Suzuki, Osaka (JP); Fumio Echigo, Osaka (JP); Daizo Andoh, Osaka (JP); Tatsuo Ogawa, Atlanta, GA (US); Yoshihiro Kawakita, Osaka (JP); Satoru Tomekawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 133 days.

(21) Appl. No.: 09/986,453

(22) Filed: Nov. 8, 2001

(65) Prior Publication Data

US 2002/0131248 A1 Sep. 19, 2002

(30) Foreign Application Priority Data

Dec. 27, 2000 (JP) .................... P2000-397329

(51) Int. Cl.⁷ ................. H05K 12/04; H01R 1/11
(52) U.S. Cl. .............. 174/264; 174/255; 174/256; 174/261; 174/262; 361/792; 428/209
(58) Field of Search ............... 174/255, 262, 174/261, 264, 256; 361/792, 803; 428/209

(56) References Cited

U.S. PATENT DOCUMENTS

| | | | | |
|---|---|---|---|---|
| 3,644,166 A | * | 2/1972 | Gause | ............ 442/23 |
| 4,086,095 A | * | 4/1978 | McLeod | ............ 106/1.17 |
| 4,967,314 A | * | 10/1990 | Higgins, III | ............ 361/792 |
| 5,021,296 A | * | 6/1991 | Suzuki et al. | ............ 428/409 |
| 5,481,795 A | * | 1/1996 | Hatakeyama et al. | ............ 29/852 |
| 6,488,869 B2 | * | 12/2002 | Takezawa et al. | ............ 252/513 |

FOREIGN PATENT DOCUMENTS

| | | |
|---|---|---|
| JP | 06-268345 | 9/1994 |
| JP | 07-142863 | 6/1995 |
| JP | 11-054865 | 2/1999 |

\* cited by examiner

*Primary Examiner*—Kamand Cuneo
*Assistant Examiner*—I B Patel
(74) *Attorney, Agent, or Firm*—McDermott, Will & Emery (57) ABSTRACT

A protective agent 6 for protecting a wiring 1 is dispersed and placed in mottle-like on an interface between a via 3 and a wiring layer 2. Then, each dimension of interface regions 7 where the protective agent 6 does not exist is set to such a size that a plurality of conductive powders 4 constituting the via 3 can abutted on the wiring layer 2. Therefore, the plurality of conductive powders 4 and the wiring layer 2 are abutted each other in each interface region 7 where the protective agent 6 does not exist to electrically connect, thereby stabilizing the connection resistance for a prolonged period of time.

12 Claims, 7 Drawing Sheets

CIRCUIT BOARD AND ITS MANUFACTURE METHOD

BACKGROUND OF THE INVENTION

1. Field of the Invention

The present invention relates to a circuit board used various electronic apparatuses.

2. Description of the Related Art

With a recent trend for a smaller size and a lighter weight of electronic apparatuses and a higher functionality thereof, there have been desired for such a circuit board that is smaller in size, lighter in weight, and higher in signal processing capability as well as mounting density. The manufacturing of such a circuit board that can meet these desires requires technologies for increasing the number of layers, decreasing the diameter of a via hole, and finer patterning of the circuits implemented thereon. Therefore, those desires have been extremely difficult to satisfy by a circuit board on which interlayer electrical connections are implemented by the conventional through-hole construction.

To meet those desires, new circuit boards have been developed. The materials of the circuit board have also included, besides the conventional glass-based materials, organic fiber-based materials and films on a trial basis.

One representative of such circuit boards employs a full-IVH construction in which the interlayer connection is implemented by conductive paste (see Japanese Patent Publication No. 2601128). This circuit board uses a composite material such as aramid-epoxy resin to form insulator layers thereof, to have such advantages as a smaller coefficient of thermal expansion, a lower dielectric constant, and a lighter weight, thus finding wide application in a variety of electronic apparatuses.

To further improve the functionality of the circuit board, however, it is necessary to secure the stability in its connection resistance for further prolonged period of time.

SUMMARY OF THE INVENTION

In view of the above, it is a principal object of the present invention to secure a further prolonged stability of the connection resistance.

For the purpose of achieving the above mentioned object, in short, A circuit board of the present invention includes: at least two wiring layers; an insulator layer for electrically insulating the wiring layers; a via provided in the insulator layer to electrically connect the wiring layers each other; and a protective agent dispersed and placed in mottle-like on an interface between the via and the wiring layer to protect the wiring layers, wherein:

each dimension of the interface regions where the protective agent does not exist is set to such a dimension that a plurality of conductive powders constituting the via may abutted on the wiring layer; and the plurality of the conductive powders and the wiring layers are abutted each other in each the interface regions where the protective agent does not exist to electrically connect.

With this structure, the following actions are demonstrated. In a region where the protective agent does not exist in an adhering region between the wiring layer and the via, the conductive powder constituting the via and the wiring layer are interconnected electrically. Moreover, in a region where the protective agent does not exist, since the plurality of the conductive powders abut on the wiring layer to be electrically interconnected, the electrical connection is further strengthened, thereby ensuring the prolonged retention stability and reliability of the connection resistance. Further, in a region where the protective agent exists, the wiring layer and the via can be prevented from invasion of water or oxidation by means of protection of a protecting layer.

In this case, it is preferable that the protecting layer is provided on the surface of the wiring layer. Therefore, it is relatively easy to provide the protecting layer on the interface.

The protective agent that can be used in the present invention may include substance that contains, for example, zinc or nickel.

Further, the protective agent can be made of such a material that enhances the adhesion strength between the via and the wiring layer to strengthen the physical adhesion therebetween, thus further improving the prolonged retention stability.

The protective agent that may improve the adhesion strength includes a substance containing a chromate or a silane coupling agent.

Further, when the conductive powder and the wiring layer are joined each other by metallic agglutination, a corresponding metallic bond develops therebetween, whereby a strong conductive path is formed to obtain good electrical connection. As a result, the prolonged retention stability and reliability of the connection resistance are further improved.

Further, if the size of the region where metallic agglutination develops between the wiring layer and the via is increased to 0.03% or more of the cross-sectional area of the via, the prolonged retention stability and reliability of the connection resistance can be further improved.

Further, if the via is made of a resin component containing a conductor, it can be shrunk by heating it under pressure, to thereby increase the ratio of occupation of the conductor component in the via, thus further securing the conductive path.

Further, if the conductor contained in the via is made of the same material as that of the wiring layer, the metallic bond or agglutination can be generated easily.

Such a circuit board can be manufactured by a method including the steps of: forming a through hole on an insulator layer and then filling the through hole with a conductive paste; dispersing and forming a protective agent in mottle-like on an adhesion surface of a conductor foil which provides a wiring layer, and dispersing and forming each dimension of adhesion surface regions where the protective agent does not exist in a state that the plurality of the conductive powders constituting the conductive paste is set to be capable of abutting on the said wiring layer; sticking the conductor foil to the insulator layer; and electrically and physically joining the conductor foil and the conductive paste by abutting the plurality of the conductive powders and the conductor foil each other by means of heating and pressurizing for the insulator layer.

Here, the protective agent is stored and placed into a minute recesses portion in the adhesion surface by abutting the adhesion surface of the conductor foil on a protective agent containing liquid, while a storage amount of the protective agent for the minute recess portion is controlled by adjusting abutting time of the protective agent containing liquid, thereby setting each dimension of the adhesion surface regions where the protective agent does not exist.

In addition, in accordance with a method of setting each dimension of the adhesion surface region where the protective agent does not exist, the protective agent is stored and placed into the minute recess in the adhesion surface by abutting the adhesion surface of the conductor foil on the protective agent containing liquid, while the storage amount of the protective agent for the minute recess is adjusted by adjusting containing amount of the protective agent of the protective agent containing liquid, thereby setting each dimension of the adhesion surface region where the protective agent does not exist.

Still further, a layer containing the protective agent is formed on the adhesion surface of the conductor foil, then, the protective agent layer is polished to such an extent that a top portion of minute protrusion on the adhesion surface may be exposed, while an exposed amount of the top portion of minute protrusion is adjusted at polishing, thereby setting each dimension of the adhesion surface region where the protective agent does not exist.

BRIEF DESCRIPTION OF THE DRAWINGS

The other objects of the present invention will be more apparent from the following description of the description of the embodiments and described in the appended claims. Many advantages not described in this specification will occur to those skilled in the art by practicing the present invention.

DETAILED DESCRIPTION OF THE INVENTION

The following will describe in detail the preferable embodiments of the present invention with reference to the drawings.

Figure 1:
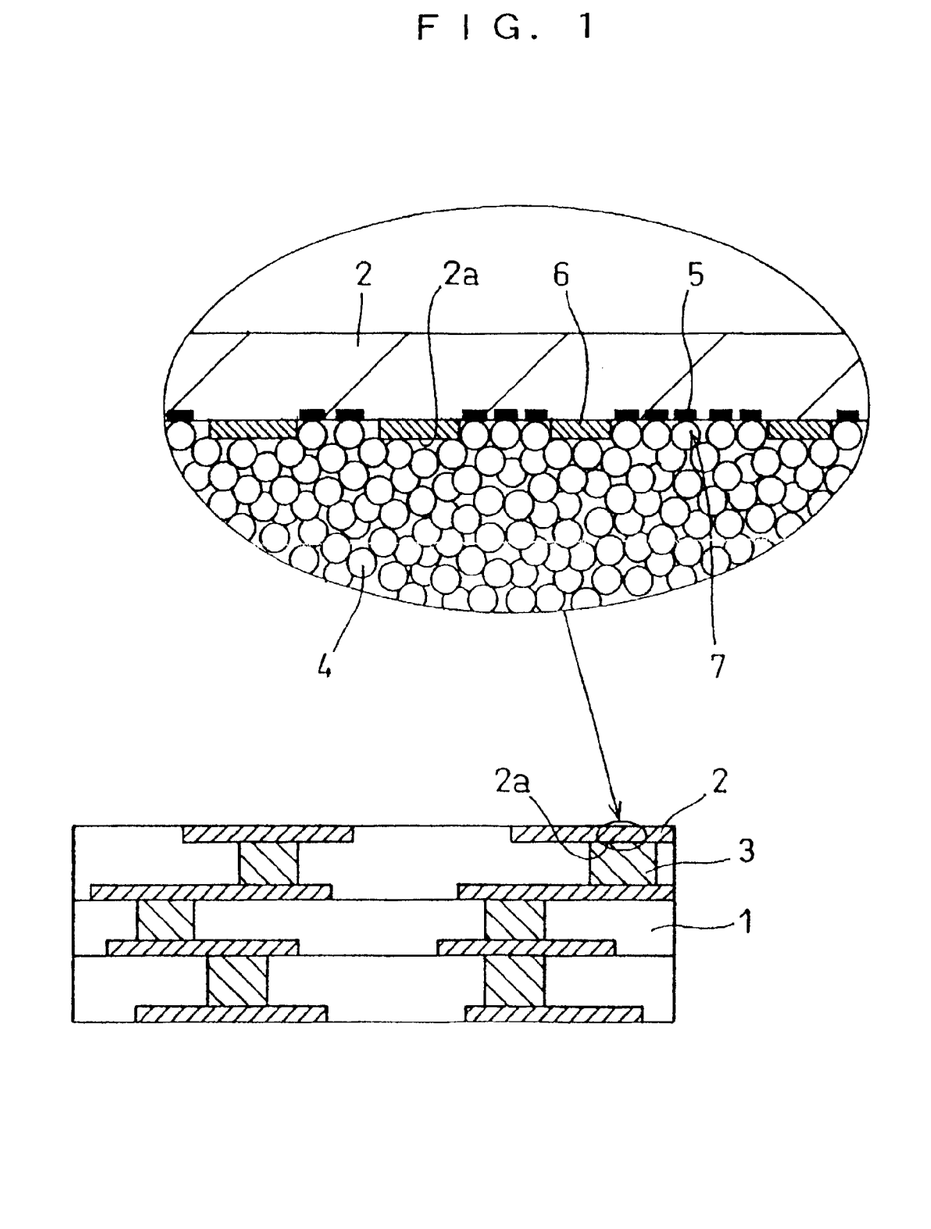
FIG. 1 is a cross-sectional view for showing a structure of a circuit board according to a preferred embodiment of the present invention.
Figure 2:
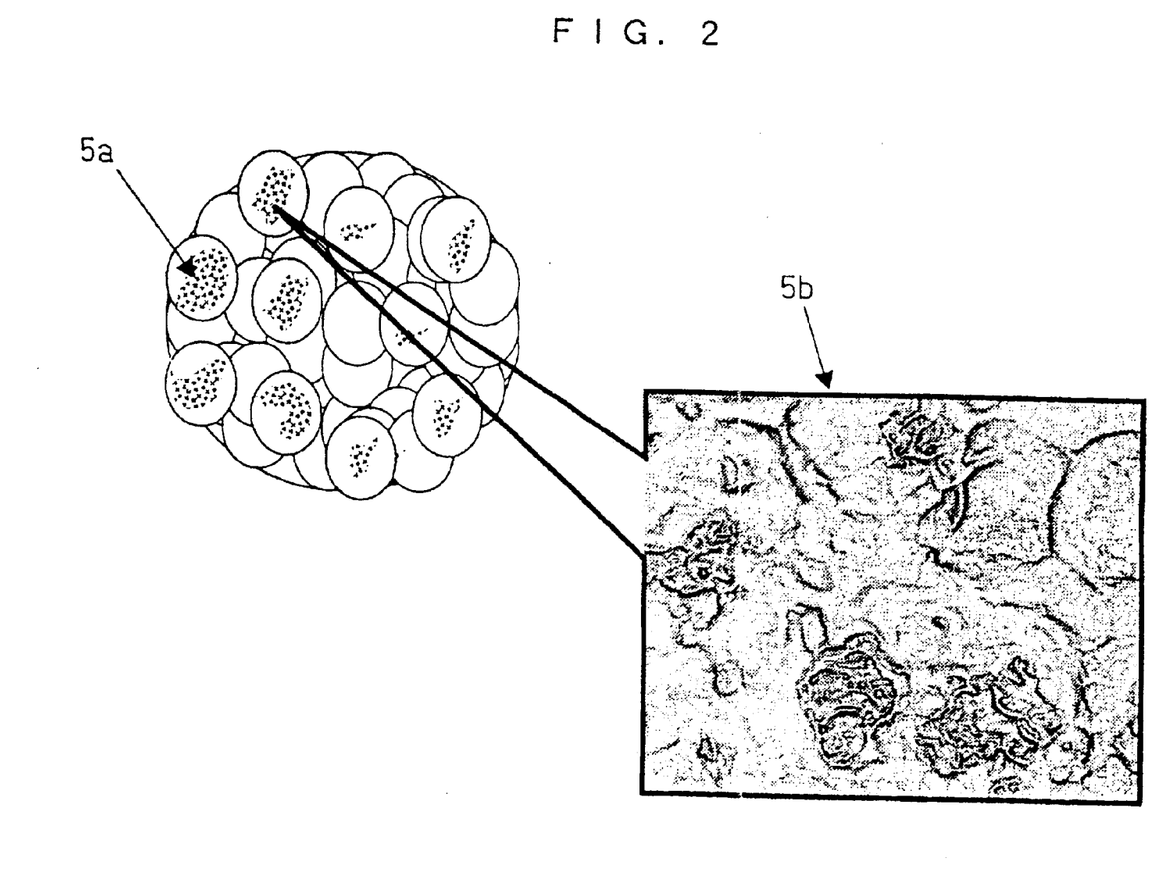
FIG. 2 is an imaginary illustration for showing a metallic agglutination portion.

FIG. 1 is a cross-sectional view showing a structure of a circuit board of one embodiment of the present invention, and FIG. 2 is an imaginary illustration of a metallic agglutination portion.

In FIG. 1, a reference numeral 1 indicates an insulator layer, a reference numeral 2 indicates a wiring layer, a reference numeral 3 indicates a via, a reference numeral 4 indicates a conductive powder, a reference numeral 5 indicates a metallic agglutination portion, and a reference numeral 6 indicates a protective agent. In FIG. 2, a reference symbol 5a indicates an agglutination mark and a reference symbol 5b indicates an image thereof.

In a circuit board shown in FIG. 1, an insulator layer 1 and a wiring layer 2 are stacked alternately and interlayer electrical connection is performed by a via 3.

The circuit board has the following features. At least in such a surface section (hereinafter referred to as a via abutting surface) 2a on the surface of the wiring layer 2 that abuts on the via 3, a protective agent 6 for protecting the wiring layer 2 is dispersed and placed in mottle-like. On this via abutting surface 2a, each of regions 7 where the protective agent 6 does not exist is sized such that a plurality of conductive powders 4 constituting the via 3 can abut on the surface of the wiring layer 2.

In such a structure of the wiring layer 2, in each of the regions 7, a plurality of the conductive powders 4 is abutted on the wiring layer 2 to thereby connect the via 3 and the wiring layer 2 electrically. Moreover, the conductive powders 4 and the wiring layer 2 are physically and electrically connected by metallic agglutination on both sides.

The circuit board of this embodiment can be manufactured as follows, for example.

Figures 3A, 3B:
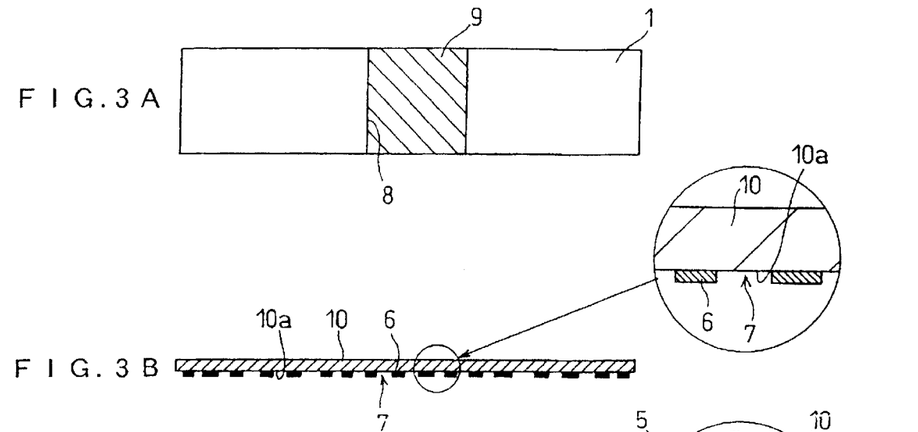
FIGS. 3A to 3D show an example for manufacturing the circuit board of the embodiment, respectively.

First, as shown in FIG. 3A, a through hole 8 is formed by laser treatment or the like, in the insulator layer 1 made of a prepreg obtained by impregnating an aromatic polyamide non-woven fabric with a thermosetting resin such as a thermosetting epoxy resin.

Thus formed through hole 8 is filled with a conductive paste 9. As shown in FIG. 3B, on the other hand, on an adhesion surface 10a (which serves as a via abutting surface 2a) of a conductor foil 10 which provides the wiring layer 2, such a protective agent 6 is dispersed and formed in mottle-like that is composed of zinc, nickel, chromate, silane coupler or the like. In this step, each of the regions 7 where the protective agent 6 does not exist is set such that a plurality of the conductive powders 4 composing the conductive paste 9 may abut against the wiring layer 2.

The dimension of the regions 7 can be thus set by the following three methods.

Figure 4A:
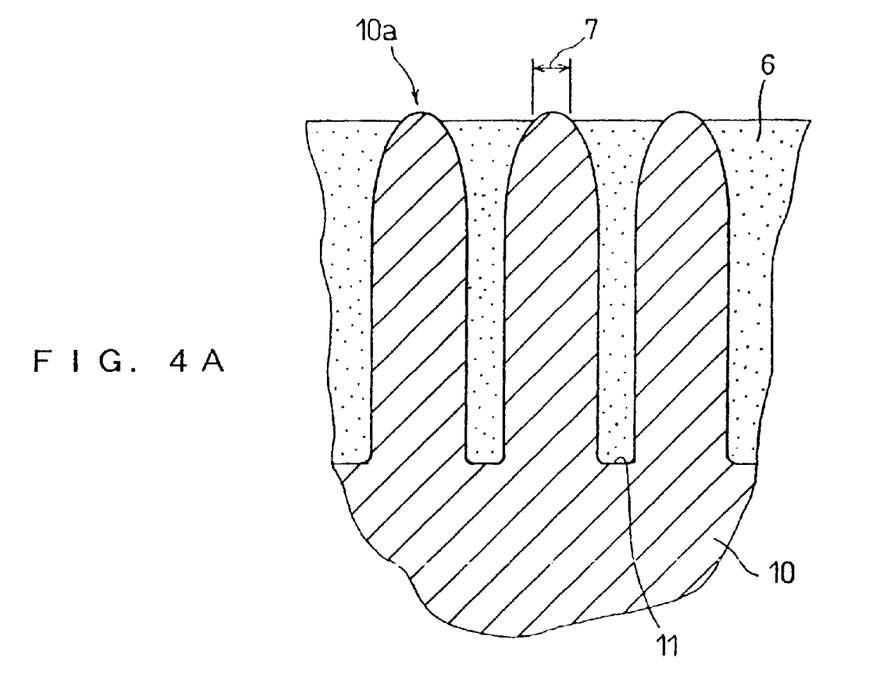
FIGS. 4A and 4B are illustrations for showing a change in shape of a main part in the circuit board manufacturing method of the embodiment, respectively.

By the first method, as shown in FIG. 4A, a chemical agent containing the protective agent 6 (hereinafter referred to as a protective agent containing liquid) is prepared, to which is then abutted on the adhesion surface 10a (which is adhered to the insulator layer 1 including the via 3) of the conductor foil 10. With this, the protective agent 6 is stored and placed into minute recesses 11 in the adhesion surface 10a. In this step, the processing time for which the adhesion surface 10a is abutted on the protective agent containing liquid is adjusted to thereby control the amount of the protective agent 6 stored in the minute recesses 11, thus appropriately setting the dimension of each of the regions 7.

By the second method, the adhesion surface 10a of the conductor foil 10 is abutted on the protective agent containing liquid to thereby store and place the protective agent 6 into the minute recesses 11 in the adhesion surface 10a. This step is the same as that of the first method. By the second method, the amount of the protective agent 6 contained in the protective agent containing liquid is adjusted to thereby control the amount of the protective agent 6 stored in the minute recesses 11, thus appropriately setting the dimension of each of the regions 7.

Figure 4B:
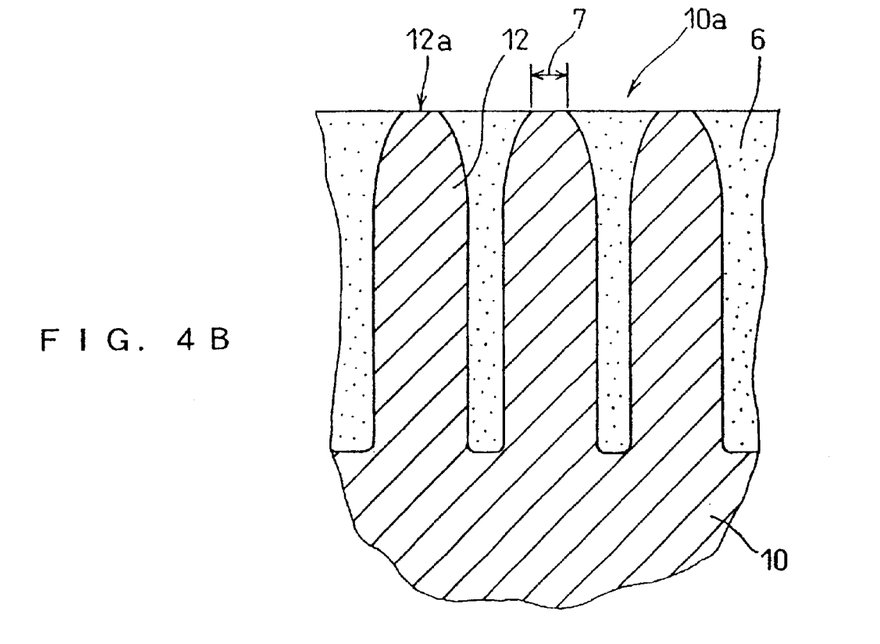

By the third method, first a layer containing the protective agent 6 is formed on the adhesion surface 10a of the conductor foil 10. In this step, the layer containing the protective agent is formed in such a manner as to cover everywhere on the adhesion surface 10a. Then, this layer containing the protective agent is polished by etching and the like. In this step, the extent of polishing is adjusted to thereby control, as shown in FIG. 4B, an extent to which the top portion 12a of each of minute protrusions 12 on the adhesion surface 10a is exposed, thus appropriately setting the dimension of each of the regions 7.

Figure 3C:
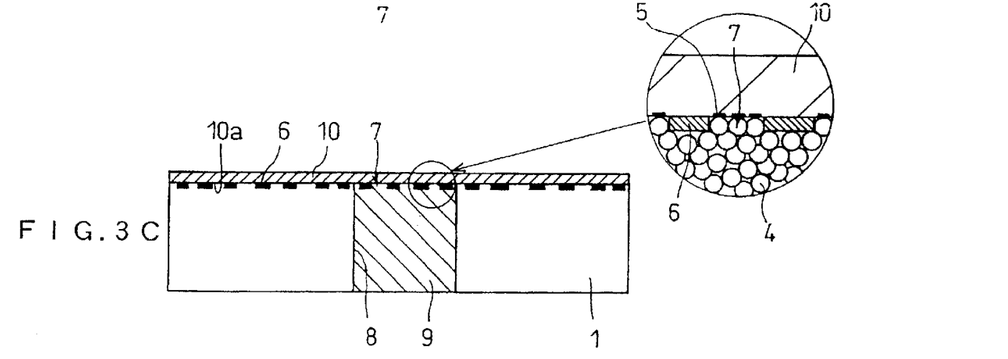

After the protective agent 6 is thus dispersed and formed in mottle-like on the adhesion surface 10a of the conductor foil 10, as shown in FIG. 3C, the conductor foil 10 is stuck to the insulator layer 1. Then, by heating under pressure the insulator layer 1 and the conductor foil 10 (under such conditions of, for example, a temperature of 200° C., at a pressure of 4.9 MPa, and a duration of one hour), the conductor foil 10 is fixed to the insulator layer 1. In this case, a plurality of the conductive powders 4 is abutted on the surface of the conductor foil 10 to thereby electrically and physically join the conductor foil 10 and the conductive powders 4 contained in the conductive paste 9 to each other.

In this step of electrically and physically joining the conductor foil 10 and the conductive paste 9 to each other, they are specifically heated under pressure to thereby form a metallic agglutination portion 5 on an adhesion interface between the conductor powders 4 and the conductor foil 10. A metallic bond by the metallic agglutination portion 5 gives a secure conductive pass to thereby provide good electrical connection.

Figure 3D:
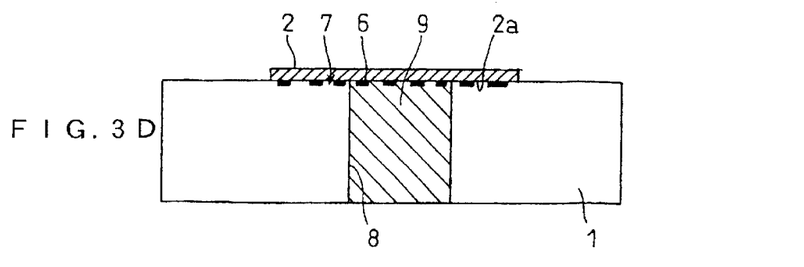

After the conductor foil 10 and the conductive paste 9 are electrically and physically jointed to each other, as shown in FIG. 3D, the conductor foil 10 is patterned by photolithography to form the wiring layer 2.

In contrast to such a both-side circuit board thus manufactured, a multiple layer circuit board having four layers, for example, is manufactured as follows. Although the following description exemplifies a four-layered multiple layer circuit board, it may be applied to a multiple layer circuit board having any other number of layers.

A pair of other insulator layers 1 in which the through hole 8 is filled with the conductive paste 9 are prepared to then sandwich a both-side circuit board therebetween, on both sides of which is in turn stacked the conductor foil 10 (having the protective agent given already) which is made of copper or the like. It then undergoes heat treatment under pressure under almost the same conditions as described above to then pattern the conductor foil 10, thus manufacturing the four-layered circuit board.

Figure 5:
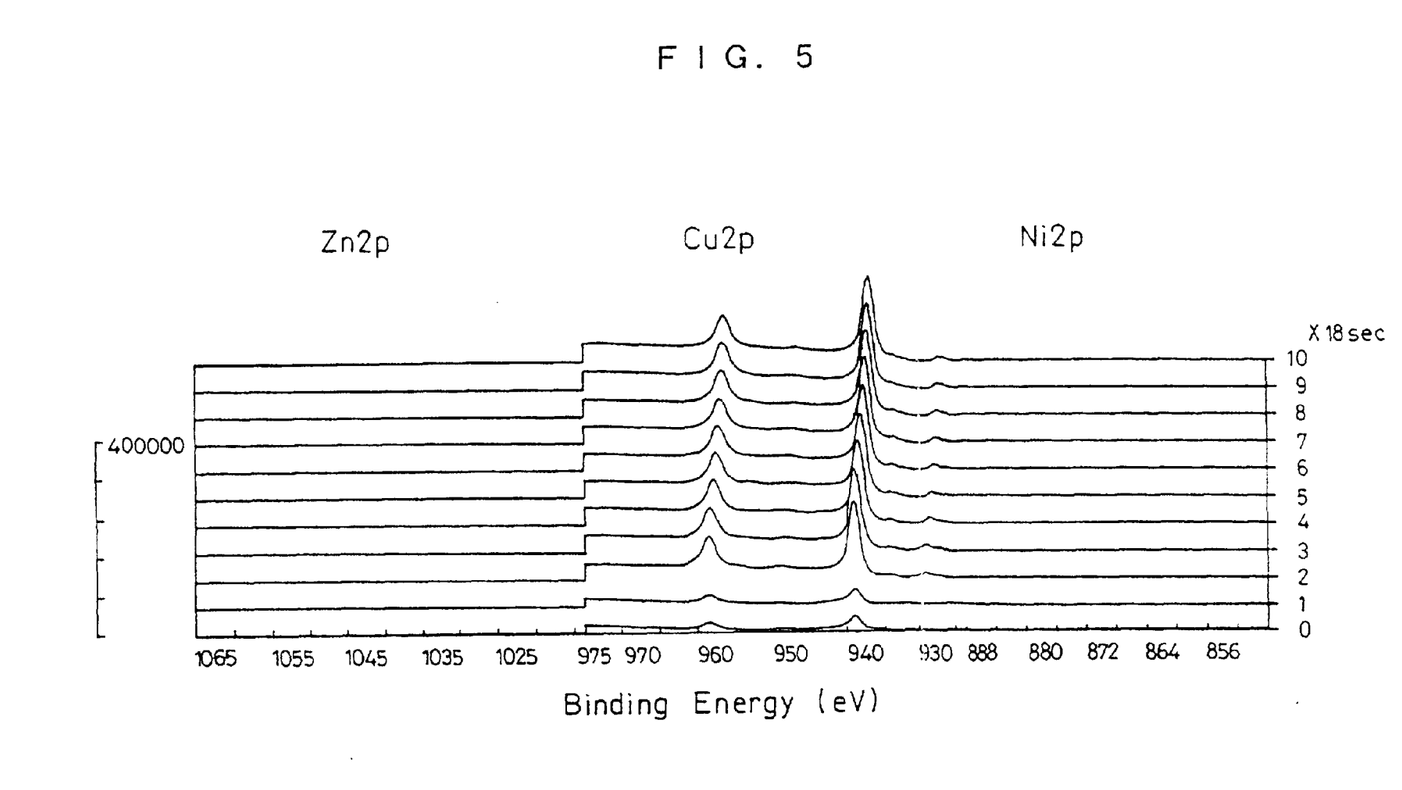
FIG. 5 is a graph for showing a result of measuring characteristics of the circuit board of the embodiment.
Figure 6:
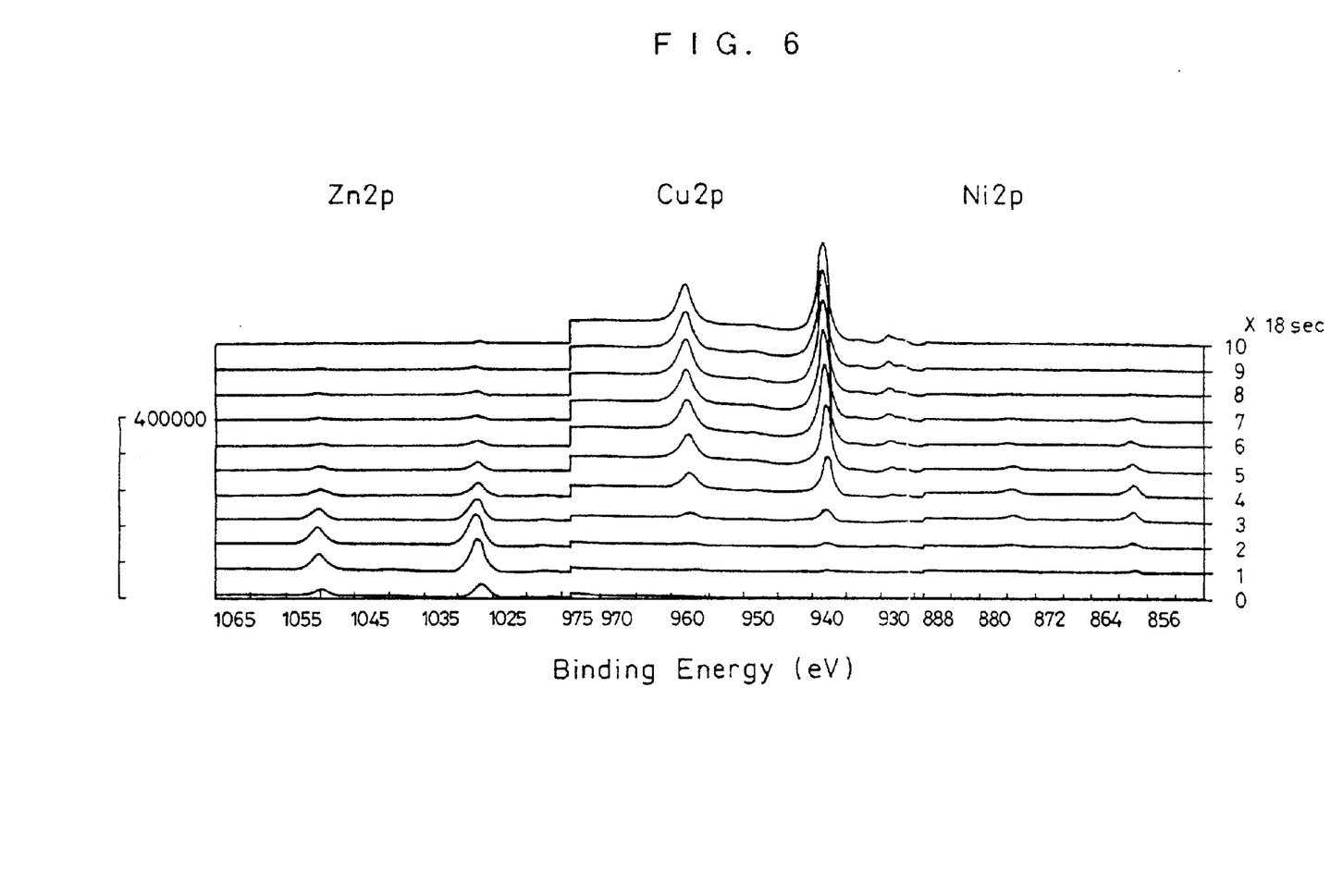
FIG. 6 is a graph for showing a result of measuring characteristics of a circuit board of an comparative example.
Figure 7:
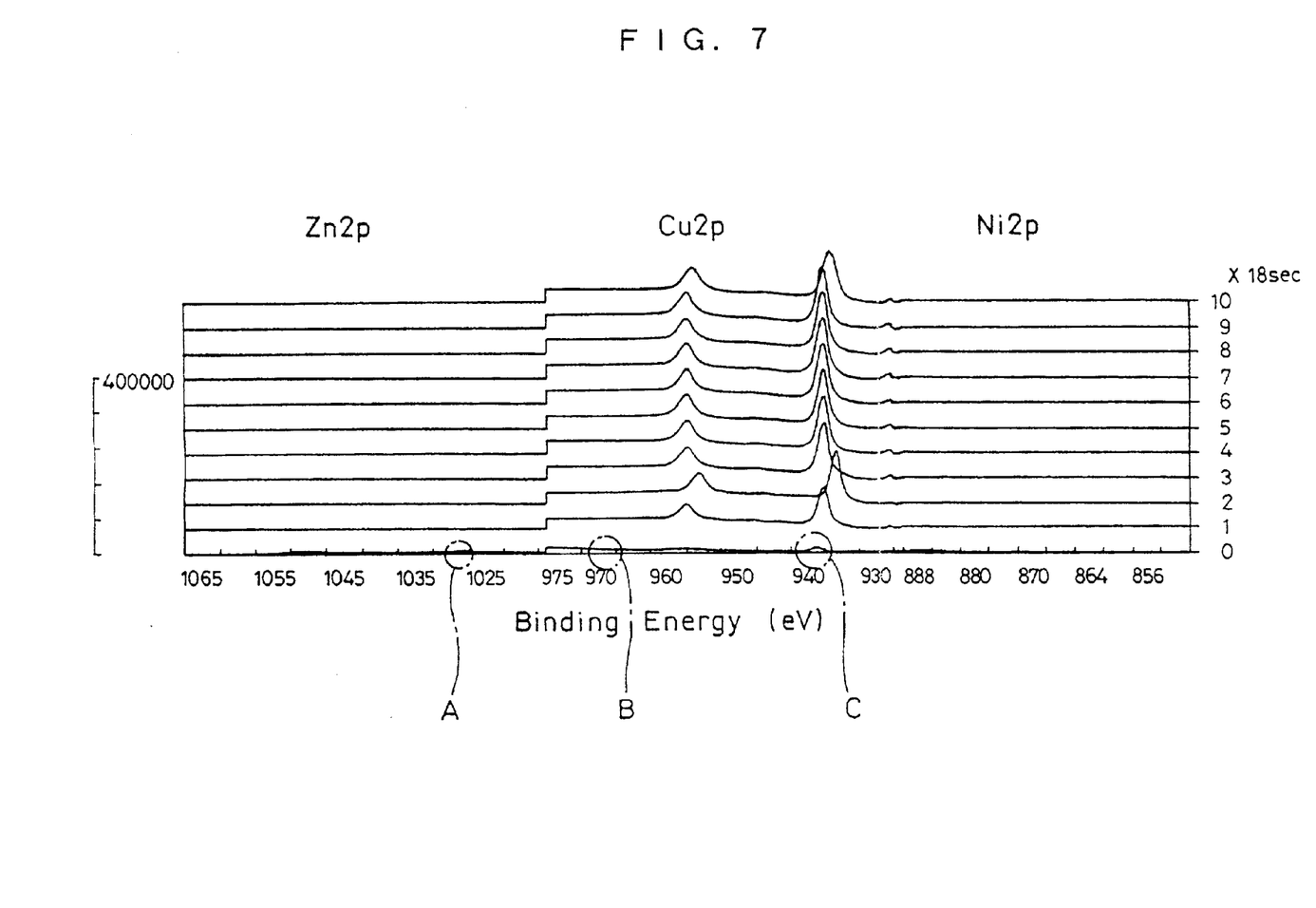
FIG. 7 is a graph for showing a result of measuring characteristics of a circuit board of another comparative example.

FIGS. 5 to 7 are graphs showing respective results of analyzing the state of the outermost surface of the copper foil used in the above-mentioned embodiment as well as comparative examples 1 and 2 using an XPS apparatus (X-ray photoelectron spectrum analyzer). In these, zinc and nickel are used as the protective agent 6.

FIG. 5 shows the results of the comparative example 1 obtained by analyzing, using an XPS apparatus, the adhesion surface 10$a$ of the conductor foil 10 (copper foil) which does not undergo surface treatment at all by use of the protective agent 6. FIG. 6 shows the results of the comparative example 2 obtained by likewise analyzing the adhesion surface 10$a$ of the conductor foil 10 (copper foil) covered everywhere by the protective agent 6 composed of zinc and nickel. FIG. 7 shows the results of the embodiment of the present invention obtained by likewise analyzing the adhesion surface 10$a$ of the conductor foil 10 (copper foil) on which the protective agent 6 composed of zinc and nickel is dispersed and placed in mottle-like.

In those graphs, the horizontal axis shows a shift amount and the vertical axis shows a frequency of the measurement results. Each of the data items indicates a result of measuring the state of the uppermost layer of the adhesion surface 10$a$ each moment in time it is reduced in thickness little by little by sputtering conducted thereon at an interval of 18 seconds. In those graphs, the lower data indicates the state of the positions closer to the uppermost surface and the lowest data indicates that of the uppermost surface.

It can be clearly seen from those graphs that on such an uppermost face of the adhesion surface 10$a$ of the comparative example 2 that has the conductor foil (copper foil) 10 covered everywhere by the protective agent 6 made of zinc and nickel, only the protective agent 6 exists. It is also clear that on such an uppermost face of the adhesion surface 10$a$ of the comparative example 1 that has the conductor foil (copper foil) 10 which does not undergo surface treatment at all by use of the protective agent 6, only the conductor foil 10 exists. In contrast, it is clear that on such an uppermost face of the adhesion surface 10$a$ of the embodiment of the present invention that has the conductor foil 10 on which the protective agent 6 is dispersed and placed in mottle-like, the conductor foil 10 and the protective agent 6 exists as mixed. Note here that symbols A, B, and C indicate the peak states of the protective agent 6 in FIG. 7.

In the circuit board of the present invention, for example, by reducing the extent to which the surface treatment by use of the protective agent 6 is conducted on the wiring layer 2 (conductor foil 10), the protective agent 6 is placed in mottle-like on the via abutting surface 2$a$ of the wiring layer 2. This process causes a plurality of the conductive powders 4 to abut against the wiring layer 2 and be electrically connected therewith in the region 7 where the protective agent 6 does not exist. This stabilizes electrical characteristics of the conductive path formed resultantly. Further, electrical connection is realized by metallic agglutination between the wiring layer 2 and the conductive powders 4 contained in the conductive paste 9, thus further securing more stronger conductive path. Those factors contribute to stabilized and prolonged connection resistance.

Further, since the protective agent 6 exists where electrical connection is not desired, it is possible to prevent oxidizing of the surroundings of the conductive path forming regions and also an external water content from penetrating into those conductive path forming regions.

As the protective agent effective in prevention of oxidization and penetration of water contents, such materials as zinc or nickel are suitable. Further, as the protective agent 6, a chromate or silane coupler may be used to effectuate prevention of oxidation and water-content penetration and also to enhance the adhesion strength between the wiring layer 2 and the via 3.

Although the embodiment has employed a copper foil as the wiring layer 2, the present invention is not limited thereto; for example, a stainless steel, aluminum, nickel, and other publicly known metal foils may be used to have the same effects.

Further, the embodiment has employed as the insulator layer 1 such a prepreg obtained by impregnating an aromatic polyamide non-woven fabric with a thermosetting epoxy resin. The present invention, however, is not limited to use thereof as the insulator layer 1 (base material); for example, it may be possible to use other materials such as a glass-fabric base material, a glass non-woven fabric base material, an aramid fabric base material, an aramid non-woven fabric base material, a liquid crystal polymer non-woven fabric base material or the like.

Further, the thermosetting resins that can be used in the present invention may include a phenol resin, a naphthalene-based resin, a urea resin, an amino resin, an alkyd resin, a silicon resin, a furan resin, an unsaturated polyester resin, an epoxy resin, a polyurethane resin, and other publicly known thermosetting resins. The prepreg composing the insulator layer 1 can be given by combining any of these base materials and thermosetting resins to provide the same effects as the embodiment.

Further, although the embodiment has used as the insulator layer 1 such a prepreg that is obtained by impregnating the base material with a resin, the present invention is not limited thereto; for example, a polymer film may be used as the insulator layer. The polymer films that can be used may include a poly-imide film, an aramid film, a liquid crystal polymer film, and other publicly known polymer films.

Note here that the conductive paste 9 that can be used in the present invention is composed of at least the conductive powders 4 and a thermosetting resin, the conductive powders 4 of which may include copper powders, silver powders, nickel powders, aluminum powders, other metal powders, and powders covered by any of these metals. The conductive powders 4 may take on such a form as a resin, flake, cube, or undefined form. The thermosetting resins that can be used in the present invention may include a phenol-based resin, a naphthalene-based resin, a urea resin, an amino resin, an alkyd resin, a silicon resin, a furan resin, an unsaturated polyester resin, an epoxy resin, a polyurethane resin, other publicly known resins, and any appropriate combinations thereof. Further, an additive or solvent may be added to such a thermosetting resin to adjust the oxidation stability and viscosity of the conductive paste.

Table 1 shows the results of evaluation (PCT test, high temperature/high humidity environment test, solder-reflow resistance test) of the connection reliability of the circuit board obtained in the embodiment of the present invention as well as the comparative examples 1 and 2.

As described above, the comparative example 1 is used such a circuit board that has the wiring layer 2 which did not undergo surface treatment by use of the protective agent 6 at all. Likewise, the comparison example 2 has used such a circuit board that has the wiring layer (copper foil) 2 covered everywhere by the protective agent 6 composed of zinc and nickel.

Note here that by the PCT test, a sample was measured for its connection resistance before and after it was placed under such an environment that the temperature was 121° C., the pressure was 0.2 Mpa, and the duration was 300 hours, to then calculate a ratio of change in the connection resistance measurements for evaluation.

In the solder reflow-resistance test, each sample was measured for its connection resistance before and after it underwent 10 cycles of reflow processing, each of which was conducted at a temperature of 230° C. for 30 seconds, to then calculate a ratio of change in the connection resistance measurements for evaluation.

In the high temperature/high humidity environment test, each sample was measured for its connection resistance before and after it was placed in such an environment that the temperature was 85° C., the humidity was 85%, and the duration was 168 hours, to then calculate a ratio of change in the connection resistance measurements for evaluation.

The connection resistance was measured by the four-terminal method using a 3456A-type apparatus (made by Hewlett-Packard).

TABLE 1

| Sample of: | Agglutination area (in percentage with respect to cross-sectional area of via) | Test conducted | Results* |
| --- | --- | --- | --- |
| Embodiment of the present invention | 0.03– | PCT test | ⊚ |
| | | 85° C./85% RH/168 h | ⊚ |
| | | 230° C./30 sec × 10 cycle | ⊚ |

TABLE 1-continued

| Sample of: | Agglutination area (in percentage with respect to cross-sectional area of via) | Test conducted | Results* |
| --- | --- | --- | --- |
| Comparative example 1 | 0.03– | PCT test | ○ |
| | | 85° C./85% RH/168 h | ⊚ |
| | | 230° C./30 sec × 10 cycle | ⊚ |
| Comparative example 2 | <0.01 | PCT test | Δ |
| | | 85° C./85% RH/168 h | ○ |
| | | 230° C./30 sec × 10 cycle | ⊚ |

*: ⊚ indicates less than 3%, ○ indicates 3 to 5%, and Δ indicates 5 to 10% as a value of the change ratio of the connection resistance.

As shown in Table 1, it is clear that the embodiment of the present invention provides the same initial value of the connection resistance as that of the comparative example 1 in which surface treatment by use of the protective agent 6 was not conducted at all. To obtain such a stable initial value of the connection resistance, as is clear from Table 1, it is preferable to set an area of a region subject to metallic agglutination between the wiring layer 2 and the conductive powders 4 at 0.03% or more of the cross-sectional area of the via 3.

Besides the above effects, the present invention gives the following effect. That is, since a plurality of the conductive powders 4 abuts against and is electrically connected with the wiring layer 2 in the region 7 where the protective agent 6 does not exist, the conductive path formed therebetween is further stabilized in electrical characteristics. In addition, since the protective agent 6 is dispersed and placed in mottle-like on the via abutting surface 2a of the wiring layer 2, metallic agglutination portion 5 is formed between the conductive powders 4 contained in the conductive paste 9 and the conductor (copper) in the wiring layer 2, thus further securing the conductive path. Those factors contribute to prolonged retention and therefore stabilization of the connection resistance in the circuit board.

Further, since the protective agent 6 exists in the regions not related to the electrical connection, it is possible to effectively prevent oxidation and penetration of a water content. Moreover, the protective agent 6 can be made of such a material (chromate, silane coupler and the like) that enhances the adhesion strength between the wiring layer 2 and the via 3, to enhance the adhesion strength between the wiring layer 2 and the via 3, further improving the retention stability.

As it is clear from the above description, according to the present invention, the protective agent is dispersed and placed on an interface between the wiring layer and the via in mottle-like, to thereby for a secured conductive path between the wiring layer and the conductive powders contained in the via, thus resulting in prolonged retention stability of the connection resistance. Moreover, in such a region that has no protective agent therein, a plurality of the conductive powders abuts against the wiring layer to be interconnected therewith electrically, thus further securing the connection.

Further, metallic agglutination formed between the conductive powders and the wiring layer gives rise to an extremely strong bonding force between the metal atoms because they are extremely close to each other, thus further securing the prolonged stability of the connection resistance.

Further, in the region where the protective agent is present, the wiring layer and the vias are protected by the protective agent to prevent oxidation and penetration of a water content. This contributes to securing of the conductive path, which in turn improves the electrical connection and the physical adhesion force between the wiring layer and the vias, thus providing a higher reliability circuit board.

While there has been described what is at present considered to be preferred embodiments of the present invention, it will be understood that various modifications may be made therein in terms of the combinations and the arrangement of the elements used in the preferred embodiment without departing from the spirit and the scope of the present invention.

What is claimed is:

1. A circuit board comprising:
   at least two wiring layers;
   an insulator layer for electrically insulating said wiring layers;
   a via provided in said insulator layer to electrically connect said wiring layers each other; and
   a protective agent dispersed and placed in mottle-like on an interface between said via and said wiring layer to protect said wiring layers, wherein:
   each dimension of said interface regions where said protective agent does not exist is set to such a dimension that a plurality of conductive powders constituting said via may abutted on said wiring layer; and
   the plurality of said conductive powders and said wiring layers are abutted each other in each said interface regions where said protective agent does not exist to electrically connect.

2. The circuit board according to claim 1, wherein said protective agent is provided on a surface of said wiring layer.

3. The circuit board according to claim 1, wherein said protective agent contains zinc and nickel.

4. The circuit board according to claim 1, wherein said protective agent has a function to enhance an adhesion strength between said via and said wiring layers.

5. The circuit board according to claim 4, wherein said protective agent contains a chromate or a silane coupling agent.

6. The circuit board according to claim 1, wherein said conductive powders and said wiring layers are joined to each other by metallic agglutination.

7. The circuit board according to claim 6, wherein a region where metallic agglutination occurs between said wiring layers and said conductive powders is set at 0.03% or more than a cross-sectional area of said via.

8. The circuit board according to claim 1, wherein said via is a resin component containing a conductor.

9. The circuit board according to claim 1, wherein said conductive powders contained in said via are the same conductor contained in said wiring layers.

10. The circuit board according to claim 1, wherein said wiring layers contain copper.

11. The circuit board according to claim 1, wherein said conductive powders contain at least one of copper and silver.

12. The circuit board according to claim 1, wherein said insulator layer is composed of a polymer film.

* * * * *